United States Patent

Dang et al.

[11] Patent Number: 5,949,472
[45] Date of Patent: Sep. 7, 1999

[54] METHOD AND APPARATUS FOR TUNING CHANNELS FOR CATV AND TELEVISION APPLICATIONS

[75] Inventors: Nam V. Dang, Chandler; Lewis E. Adams, III, Phoenix, both of Ariz.

[73] Assignee: Intel Corporation, Santa Clara, Calif.

[21] Appl. No.: 08/762,726

[22] Filed: Dec. 10, 1996

[51] Int. Cl.⁶ ............................ H04N 7/10
[52] U.S. Cl. ............... 348/11; 348/731; 455/180.1; 455/190.1; 455/296; 455/260; 455/209; 375/346
[58] Field of Search .................. 348/731, 732, 348/11, 470, 600, 653, 599; 455/6.1, 6.2, 180.2, 190.1, 260, 264, 315, 314, 318, 62, 63, 317; 375/224–227, 346

[56] References Cited

U.S. PATENT DOCUMENTS

| | | | |
|---|---|---|---|
| 3,636,840 | 1/1972 | Shekel et al. | 455/6.2 |
| 4,027,242 | 5/1977 | Yamanaka | 325/17 |
| 4,191,966 | 3/1980 | Ovnick | 348/11 |
| 4,198,604 | 4/1980 | Holdaway | 455/260 |
| 4,214,212 | 7/1980 | Dipietromaria | 455/190 |
| 4,340,975 | 7/1982 | Onishi et al. | 348/731 |
| 4,353,132 | 10/1982 | Saitoh | 455/132 |
| 4,395,777 | 7/1983 | Oki et al. | 455/183 |
| 4,418,428 | 11/1983 | Evans | 455/180.2 |
| 4,553,264 | 11/1985 | Hasegawa | 455/189 |
| 4,610,031 | 9/1986 | Mori | 455/263 |
| 4,639,682 | 1/1987 | Takeuchi | 329/50 |
| 4,918,748 | 4/1990 | Shahriary | 455/315 |
| 5,010,400 | 4/1991 | Oto | 348/11 |
| 5,014,349 | 5/1991 | Kubo et al. | 348/731 |
| 5,058,204 | 10/1991 | Tahernia et al. | 455/266 |
| 5,093,922 | 3/1992 | Kubo | 455/6.2 |
| 5,109,532 | 4/1992 | Petrovic | 455/63 |
| 5,200,826 | 4/1993 | Seong | 348/731 |
| 5,222,106 | 6/1993 | Satoh et al. | 455/209 |
| 5,230,095 | 7/1993 | Onedera et al. | 455/209 |
| 5,239,682 | 8/1993 | Strawcynski et al. | 455/62 |
| 5,390,346 | 2/1995 | Marz | 455/209 |
| 5,437,051 | 7/1995 | Oto | 348/731 |
| 5,471,671 | 11/1995 | Wang et al. | 455/62 |
| 5,499,388 | 3/1996 | Song | 455/62 |
| 5,524,280 | 6/1996 | Douthitt et al. | 455/62 |
| 5,606,725 | 2/1997 | Hart | 455/5.1 |
| 5,661,439 | 8/1997 | Watkins et al. | 331/1 |

*Primary Examiner*—Andrew I. Faile
*Assistant Examiner*—Reuben M. Brown
*Attorney, Agent, or Firm*—Blakely, Sokoloff, Taylor & Zafman LLP

[57] ABSTRACT

A method of tuning channels for television and community antenna television (CATV) devices includes the step of receiving a radio frequency input (RFI) signal having at least one carrier signal at frequency $f_s$ associated with a selected broadcast channel. The RFI signal is up-converted by m to a first intermediate frequency wherein the carrier signal is located at $f_s+m$. The first intermediate frequency is filtered. The filtered first intermediate frequency is down-converted by n to a second intermediate frequency wherein the second intermediate frequency includes the carrier signal at $f_s+m-n$. Additional methods for improving the reception of the selected channel include the step of varying m and n in order to avoid frequency-dependent anomalies within the pass band of the filter. For digital communications, m and n are varied in accordance with an error rate of the digital communications in order to reduce the error rate of the digital communications.

27 Claims, 7 Drawing Sheets

METHOD AND APPARATUS FOR TUNING CHANNELS FOR CATV AND TELEVISION APPLICATIONS

FIELD OF THE INVENTION

This invention relates to the field of radio frequency communications. In particular, this invention is drawn to a solid state tuner for television and community antenna television (CATV) receivers.

BACKGROUND OF THE INVENTION

The electromagnetic spectrum associated with radio frequency communications ranges includes very low frequencies (VLF) of a few kilohertz through very high frequencies (VHF) beginning at a few tens of megahertz through the ultrahigh frequencies (UHF) up to several hundred megahertz. Television and CATV signals are typically in the VHF and UHF ranges.

Tuners designed for broadband television and CATV signals must be able to tune across a range of frequencies including the VHF and UHF ranges. One type of tuner used for television and CATV signals is a band switching tuner. The band switching tuner uses a number of band tuners each designed for tuning across a specific band of frequencies. The band switching tuner uses one band tuner for detecting signals within one band of frequencies and then switches to another band tuner in order to detect signals within another band of frequencies.

One disadvantage of the band switching tuner is that each band tuner must be calibrated for its associated band of frequencies.

Another disadvantage of the band switching tuner is that air core inductors are often used in the band tuners. Air core inductors are calibrated by bending, compression, or stretching once mounted to a circuit board. Thus one disadvantage of air core inductors is that hand tuning is often required for these band tuners.

Another disadvantage of air core inductors is sensitivity to vibration. The characteristic impedance, center frequency, and bandwidth of tuners based on air core inductors can vary when the tuner is subjected to small vibrations. Although the variance might not cause noticeable affects on the quality of an analog signal, such variance can cause significant distortion to the spectral content of a digital or digitally modulated signal.

SUMMARY AND OBJECTS OF THE INVENTION

In view of limitations of known systems and methods, a method of tuning a channel for television and community antenna television (CATV) devices includes the step of selecting an upshifting frequency m in accordance with a selected channel. A radio frequency input (RFI) signal is up-converted to a first intermediate frequency signal. The RFI signal includes at least one carrier of frequency $f_s$ wherein the carrier corresponds to the selected channel. The carrier is up-converted to a frequency $f_s+m$.

The first intermediate frequency signal is filtered. A downshifting frequency, n is selected in accordance with the selected channel and a desired output frequency, K. The filtered signal is then downshifted to provide a second intermediate frequency signal including a down-shifted carrier of frequency $f_s+m-n$ wherein $f_s+m-n=K$. The up-conversion and down-conversion permits the elimination of air-core inductors in the implementation circuitry.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIGS. 2, 3, and 4 illustrate circuitry for one embodiment of the tuner. In particular.

DETAILED DESCRIPTION

Figure 1:
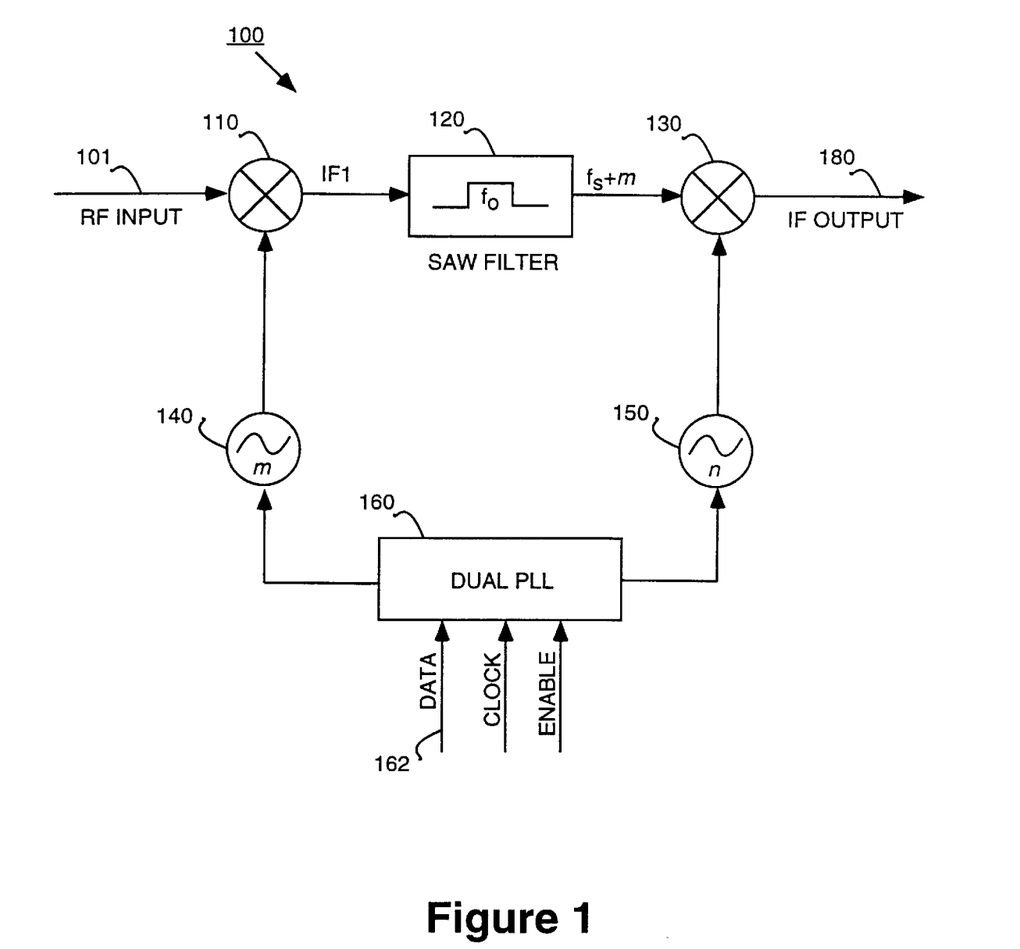
FIG. 1 illustrates a block diagram of the tuner.

The solid state tuner illustrated in FIG. 1 permits the elimination of air core inductors by up-converting and down-converting the input radio frequency (RF) signal. In particular, the input signal is up-converted to a frequency high enough so that small traces on a printed circuit board can be used for the inductances required for image rejection.

Television and CATV channel information is encoded on carriers located in different portions of the RF spectrum to permit frequency multiplexing of the channels. Thus RF input (RFI) signal 101 can consist of a number of frequency multiplexed channels. A television or CATV device tuner selects the desired channel by detecting the carrier corresponding to the desired channel from the RFI signal while rejecting carriers not associated with the selected channel. The RFI signal includes a discrete number of carrier frequencies such that $$RFI = \sum_{i=1}^{k} f_{c_i},$$

wherein $f_{c_i}$ represents the "ith" carrier frequency. Thus $f_{c_1}$ is associated with one channel and $f_{c_2}$ is associated with another channel.

Mixer 110 up-converts the RF input (RFI) signal 101 to a higher frequency. Mixer 110 mixes RFI 101 and the output of oscillator 140 to provide a first intermediate frequency (IF1) signal. The carriers within RFI are shifted to higher frequencies within IF1.

Mixers typically provide an output signal which includes frequency components corresponding to at least one of 1) the difference and 2) the sum of the frequencies of the input signals. Thus in the frequency domain, the carriers within the RFI signal are shifted along the frequency axis by an amount determined by the output frequency, m, of oscillator 140.

In one embodiment, mixer 110 provides an $IF_1$ signal wherein the frequency of each carrier signal reflects the sum of a corresponding carrier frequency in the RFI signal and the output frequency of oscillator 140 (i.e., $$IF_1 = \sum_{i=1}^{k} (m + f_{c_i}))$$

In an alternative embodiment, mixer 110 provides an $IF_1$ signal having carrier frequencies reflecting the difference between a corresponding carrier frequency in the RFI signal and the output frequency of oscillator 140

$$IF_1 = \sum_{i=1}^{k} (m - f_{c_i})).$$

Although an intermediate frequency signal created from either the sum or the difference in frequencies can be used, the carrier frequency associated with the selected channel should be greater than the highest carrier frequency of the RFI signal. Thus if $f_{c_1}$ is the frequency of the carrier associated with a selected channel, then m should be selected such that $m+f_{c_1} \geq f_{ck_k}$ when using frequency sums or $m-f_{c_1} \geq f_{c_k}$ when using frequency differences. Whether the IF1 signal reflects the sum or the differences of the carrier frequencies and the output frequency of oscillator 140, oscillator 140 and mixer 110 effectively up-convert the RFI signal by shifting the frequency of the component carriers in RFI.

The IF1 signal is filtered by filter 120. In one embodiment, filter 120 is a surface acoustic wave filter. Filter 120 serves as an image rejection filter to substantially eliminate all frequencies that are not within the pass band of the filter. In other words, filter 120 passes only the frequencies located within the pass band of the filter. Filter 120 has a center frequency $f_o$ and bandwidth BW. The pass band of filter 120 is $$f_o \pm \frac{BW}{2}.$$

Thus filter 120 substantially eliminates all portions of the IF1 signal except those frequencies, x, which are within the pass band of the filter such that $$\left(f_o - \frac{BW}{2}\right) < x < \left(f_o + \frac{BW}{2}\right).$$

A channel is selected by shifting the carrier frequency, $f_s$, associated with the selected channel so that it is within the pass band of filter 120. This is accomplished by varying the output frequency of oscillator 140 so that mixer 110 shifts the frequency of the carrier for the desired channel within the pass band of filter 120. In one embodiment, mixer 110 shifts the frequency of the carrier to approximately the center frequency of filter 120. This is accomplished by varying m so that $m+f_s \sim f_o$ where $f_s$ corresponds to the carrier frequency of the selected channel. Thus the filtered intermediate frequency signal has channel information encoded on a carrier within the pass band of filter 120 (e.g., at frequency $f_o$).

A second mixer (130) is used in combination with a second oscillator (150) to down-convert the filtered IF1 to a second intermediate frequency signal (IF OUTPUT 180). This second intermediate frequency is chosen to be a frequency compatible with the remainder of the television or CATV receiver circuitry. The channel information is presented to the remainder of the system encoded on a carrier having a constant frequency, K.

The intermediate frequency signal used by the remainder of television or CATV receiver circuitry is approximately 43.75 MHz in the United States. Therefore in one embodiment, K is approximately 43.75 MHz. In European countries, the intermediate frequency signal used by the remainder of television or CATV receiver circuitry is typically approximately 36.125 MHz. Thus in another embodiment, K is approximately 36.125 MHz. Generally, IF OUTPUT includes the channel information encoded on a carrier of fixed frequency K, wherein K is selected to be compatible with the remainder of the television or receiver circuitry. Depending upon the bandwidth of filter 120, a number of other channel carrier frequencies may also be present in the second intermediate frequency signal. This is typically the case in television and CATV tuners.

Mixer 130 provides an output signal 180 which has a frequency corresponding to the difference between the filtered $IF_1$ signal frequency (e.g., $f_o$) and the output frequency, n, of oscillator 150. In one embodiment, the desired carrier frequency $f_s$ is selected by up-converting $f_s$ to a fixed frequency such as $f_o$. Thus $f_o$-n~K. In this embodiment, given that K and $f_o$ are constants, n is also a constant of approximate value $f_o$-K.

Dual phase locked loop (PLL) 160 is used to control the output frequency of oscillators 140 and 150. Dual PLL 160 receives channel selection data signal 162 which identifies the channel to be selected. In response to the channel selection data signal, one PLL of dual PLL 160 controls oscillator 140 to have an output frequency $m=f_o-f_s$, wherein $f_s$ is the carrier frequency associated with the channel to be selected. In one embodiment, the other PLL of dual PLL 160 maintains the output frequency, n, of oscillator 150 at a constant value $n=f_o-K$ independent of the channel selected.

Television and CATV broadcasts are typically encoded on carriers ranging from approximately 50 MHz to 850 MHz. Thus filter 120 should have a center frequency greater than 850 MHz for television and CATV applications. In one embodiment filter 120 has a center frequency of approximately 915 MHz. At a minimum filter 120 should have a center frequency no less than the highest carrier frequency $f_{c_k}$ of RFI plus one half the bandwidth allocated per channel plus one half the bandwidth of filter 120.

Television and CATV devices in the United States use approximately 6 MHz bandwidth channels. In one embodiment, filter 120 has at least a 6 MHz bandwidth. Television and CATV devices in other countries such as European countries typically use 8 MHz bandwidth channels. Therefore in another embodiment, the bandwidth of filter 120 is at least 8 MHz. In other embodiments, the bandwidth of filter 120 is chosen to have substantially the same bandwidth as the channels being selected.

Filter 120 serves as an image rejection filter to reject a significant amount of the information not associated with the selected channel. Thus one filter effectively replaces the various band filters required by a band switching tuner. Due to the range and magnitude of the frequencies involved, inductances required for oscillators 140 and 150 can be constructed using fixed surface mount inductors or realized through foil patterns on the solid state tuner circuit board. These inductors are significantly less sensitive to vibration.

Figure 2:
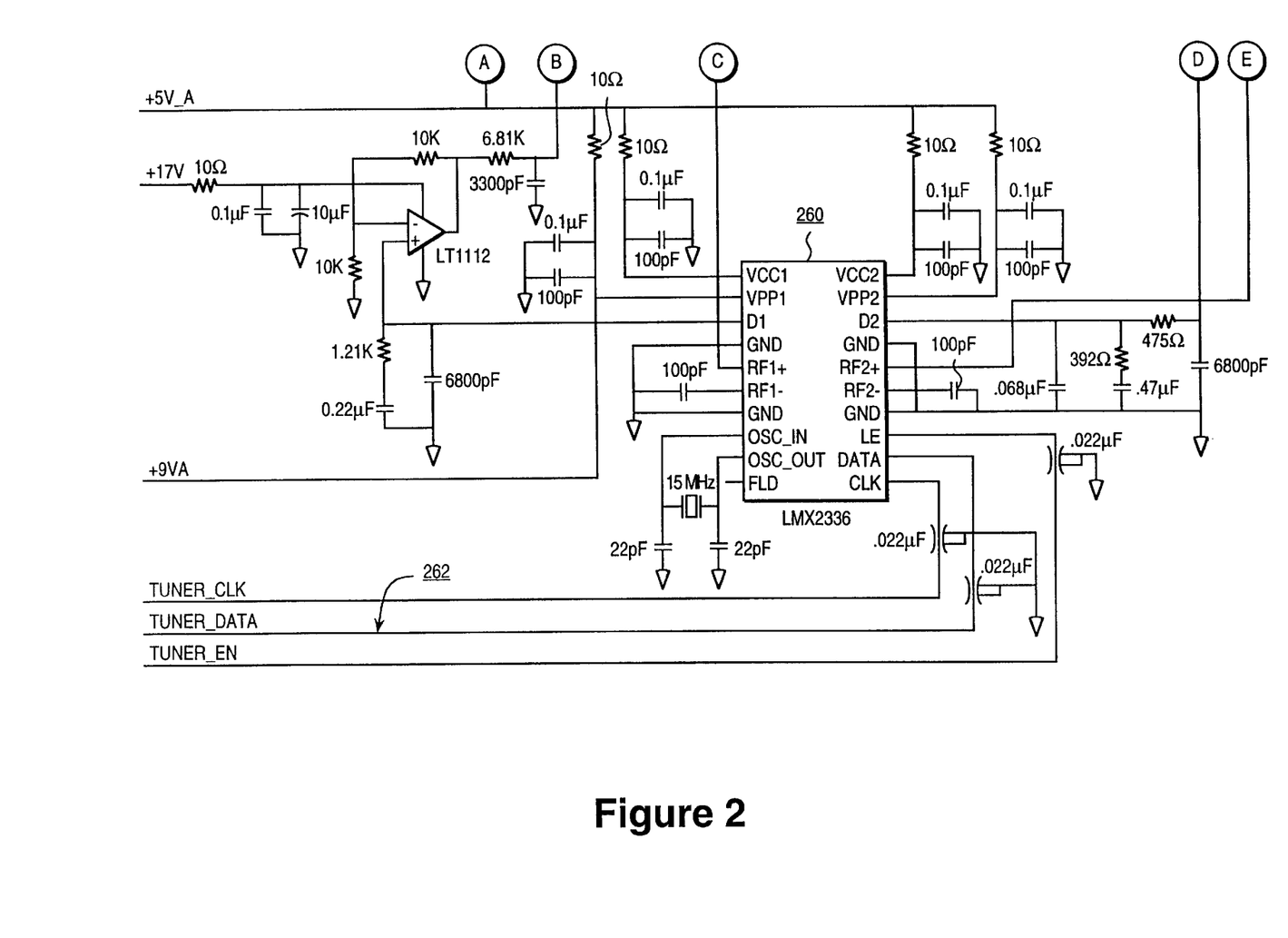
FIG. 2 illustrates phase locked loop circuitry.
Figure 3:
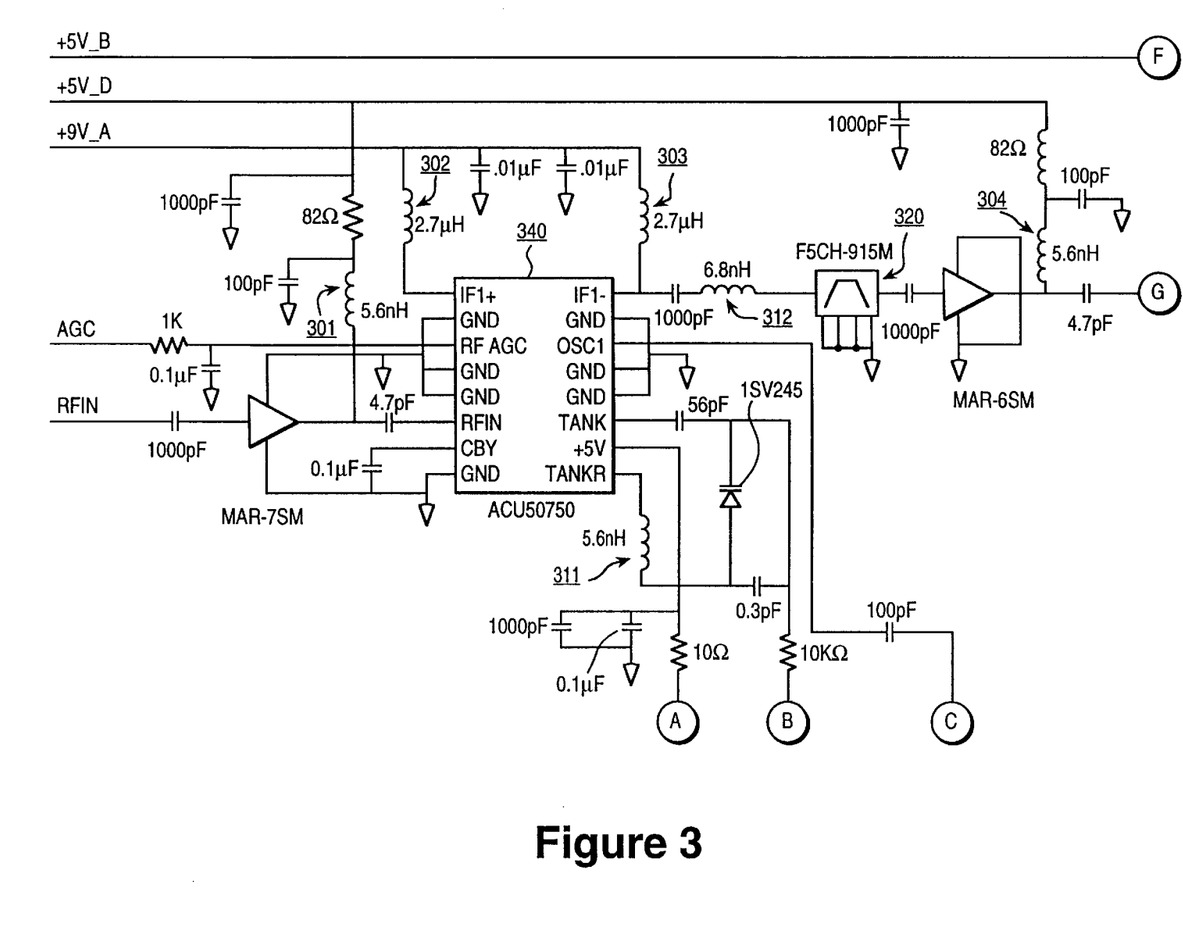
FIG. 3 illustrates the up-conversion oscillator and filter.
Figure 4:
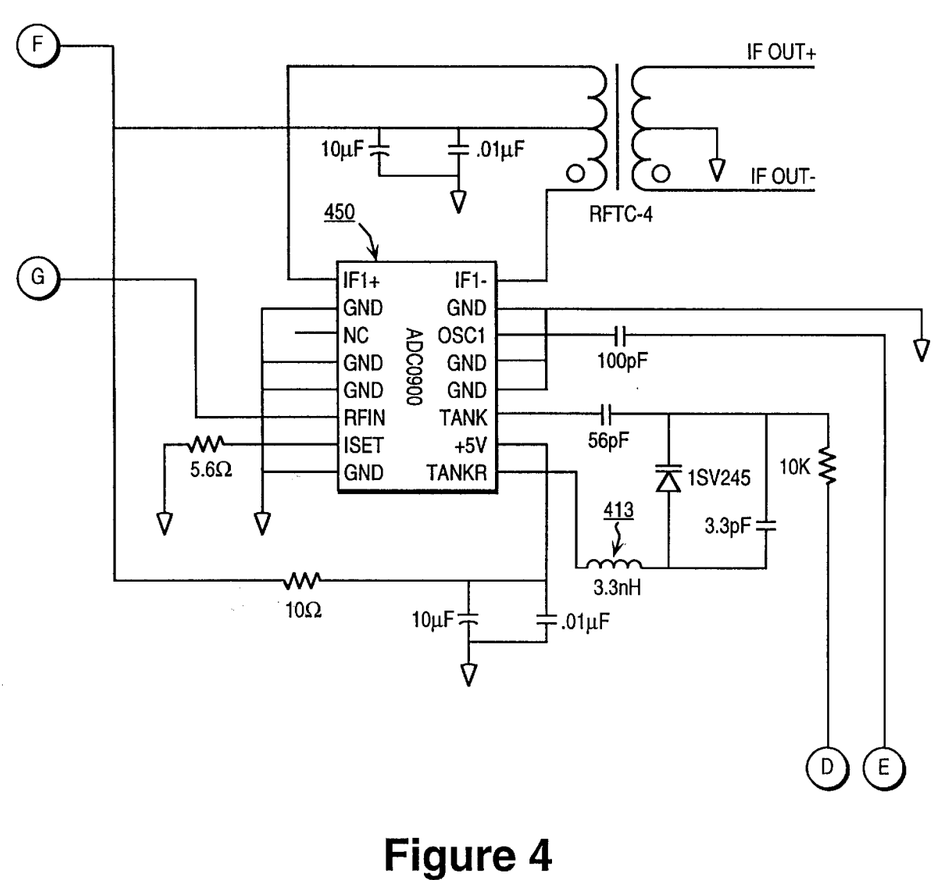
FIG. 4 illustrates the down-conversion oscillator.

FIGS. 2, 3, and 4 illustrate circuitry for one embodiment of the tuner as illustrated in the block diagram of FIG. 1. Referring to FIGS. 1, 2, 3, and 4, filter 120 is realized using surface acoustic wave filter 320. In one embodiment, filter 120 is a surface acoustic wave filter as typically found in cellular telephone communication systems. The F5CH-915M manufactured by Fujitsu Microelectronics, Inc. (San Jose, Calif.) is one example of such a filter.

Dual PLL 160 is implemented using integrated circuit 260. In the embodiment illustrated, the two phase locked loops are implemented using a single integrated circuit such as the LMX2336 manufactured by National Semiconductor Corp. of Santa Clara, Calif. In alternative embodiments, separate integrated circuits are used to implement each phase locked loop.

Oscillator 140 and mixer 110 are realized using integrated circuit 340. Integrated circuit 340 is a combination mixer/oscillator integrated circuit such as the ACU50750 manufactured by Andadigics, Inc. of Warren, N.J.

Oscillator 150 and mixer 130 are realized using integrated circuit 450. is realized using integrated circuit 340. Integrated circuit 350 is a combination mixer/oscillator integrated circuit such as the ADC0900 manufactured by Anadigics, Inc.

The illustrated circuitry includes a number of inductors. Inductors 301, 302, 303, and 304 are chokes used to filter the power supply system, however, and are not used for tuning or image rejection.

Only three inductors are required for up-conversion, down-conversion, and image rejection in the embodiment illustrated in FIGS. 2, 3, and 4. Inductors 311, 312, and 413 range from approximately 3.3 nH (nanohenries) to approximately 6.8 nH. Inductances of this scale are sufficiently small to be realized using foil patterns in the printed circuit board of the tuner as is well known in the art.

Inductors realized using foil patterns in the printed circuit board are significantly less susceptible to vibration than air core inductors. Furthermore, inductors 311 and 413 are used in the up-conversion and down-conversion stages of the tuner rather than to accomplish image rejection. This further decreases the tuner's sensitivity to vibration. As stated above, the variance may not cause noticeable effects on the quality of an analog signal. With respect to digital transmissions, however, the up-conversion and down-conversion technique helps to eliminate distortion of the spectral content of a digital or digitally modulated signal induced by small vibrations.

The block diagram of FIG. 1 permits dynamically tuning channels to minimize phase noise and filter or frequency response anomalies such as spurs. In particular, the carrier frequency of the selected channel can be up-converted to any frequency within the pass band of filter 120. Instead of up-converting every selected carrier frequency to the same fixed frequency, different carrier frequencies can be up-converted to any frequency within the pass band of filter 120 in order to accommodate filter or tuning anomalies for specific frequency ranges. Thus the selected channel can be moved away from spurs and other anomalies of the tuner.

Consider first and second channels with carrier frequencies of 100 MHz and 150 MHz. In one of the embodiments described above, the selected channel is always up-converted to the same frequency, for example 915 MHz. Thus to achieve 915 MHz m will be either 815 MHz or 765 MHz depending upon which channel is selected. The frequency response of the mixer 110 may induce anomalies at 914 MHz for the second channel and not the first channel. Instead of selecting m such that $m+f_s$ is some constant for all $f_s$, m can be any value that places $f_s$ within the pass band of filter 120. Thus in order to avoid the spur, m can be selected to shift the carrier associated with the second channel so that the anomaly and the carrier are separated by at least one-half the channel bandwidth.

For example, consider a filter having a 915 MHz center frequency and a bandwidth of 26 MHz. The pass band of the filter is 915±13 MHz or 902 to 928 MHz. To avoid an anomaly at 914 MHz, a carrier frequency with a 6 MHz bandwidth channel should be moved to frequencies greater than 917 MHz or less than 911 MHz. Given the limits of the pass band of the filter, m should be selected so that 902 MHz$\leq f_s+m \leq$911 MHz or 917 MHz$\leq f_s+m \leq$928 MHz.

Programmable PLLs permits dynamic tuning of the channels to account for such anomalies. The selected channel corresponds to a selected carrier within the radio frequency input signal. An up-conversion table can be used to determine the proper shift amount, m, to be applied to the RFI signal in order to place the selected carrier, $f_s$, within the pass band of the filter and yet avoid known spurs. Instead of $f_s+m=C$ wherein C is a constant for any selected carrier frequency, m is varied to avoid anomalies within the pass band. Thus C may vary within the pass band of the filter.

In order to accommodate placing $f_s+m$ anywhere within the pass band of the filter and yet providing a second intermediate frequency signal at frequency K, n will need to vary with m to ensure that $f_s+m-n \sim K$.

This can be accomplished by using a down-conversion table to determine the proper downshift amount, n, to be applied to the filtered signal. In one embodiment, the m and n values are stored in the same table. In an alternative embodiment, the m and n values are stored in separate tables. In one embodiment, the up-conversion and down-conversion lookup tables are indexed by channel.

Programmatic control of the tuner circuitry also permits greater control over reduction of phase noise errors. Phase noise errors introduced by the up-conversion and down-conversion stages can be altered to minimize the net phase noise introduced by the tuner.

In particular, dual phase locked loop circuit 260 of FIG. 2 uses phase detection filters. These phase detection filters can be digitally modified by providing phase filter values to the phase locked loops via data signal 262. The phase filter values do not modify the shift frequencies m and n, rather they affect the phase detection used to provide the control signals for mixer/oscillators 340 and 350.

Phase filter values for each m and n combination can be determined such that the net phase noise introduced by up-converting and down-converting when using one set of phase filter values is less than or equal to the net phase noise introduced when any other combination of phase filter values. In one embodiment, phase filter values corresponding to a selected channel are stored in a phase filter lookup table.

Figure 5:
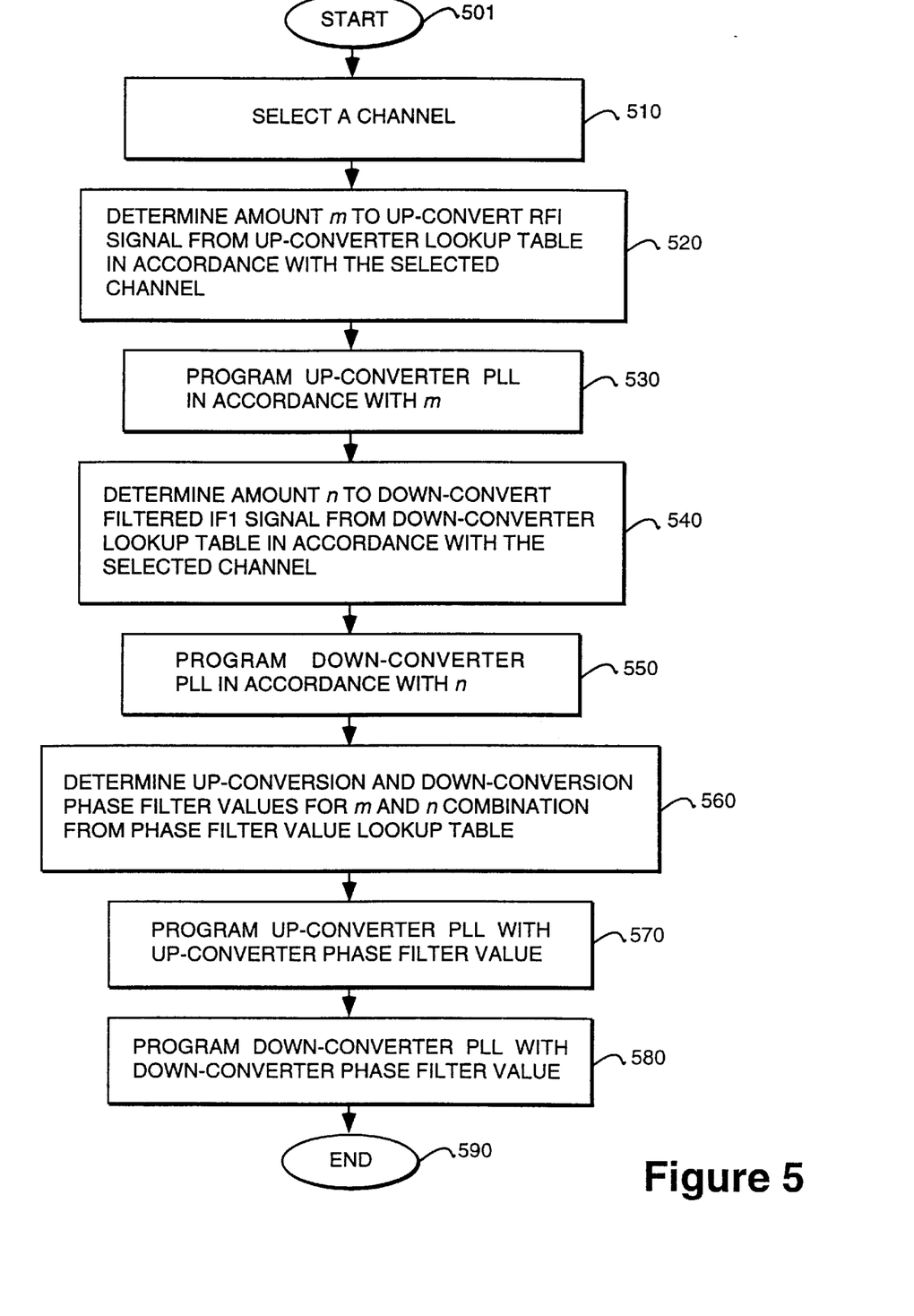
FIG. 5 illustrates a method for selecting m and n values to avoid spurs and selecting phase filter values to minimize induced phase noise.

FIG. 5 illustrates one method for selecting m, n, and phase filter values for a selected channel beginning at step 501. A channel is selected in step 510. In step 520, the amount m to up-convert the RFI signal is determined from an up-conversion lookup table. The up-converter PLL is programmed accordingly in step 530. In step 540, the amount n to down-convert the filtered IF1 signal is determined from a down-conversion lookup table. The down-converter PLL is programmed accordingly in step 550.

Once m and n are established, the phase filter values for that combination of m and n are determined from a phase filter lookup table in step 560. The up-converter PLL is programmed with an up-converter phase filter value in step 570. The down-converter PLL is programmed with a down-converter phase filter value in step 580. The process is complete in step 590.

The lookup table approach is applicable for known (i.e., static) spurs and other anomalies. Other anomalies, however, may be dynamic. Analog television and CATV circuitry often include automatic fine tuning circuitry for handling dynamic anomalies.

Automatic fine tuning circuitry for analog video signals tend to provide feedback to analog tuning circuitry to lock in or tune in a channel according to signal strength. With respect to digital communication systems, however, the error rate (e.g., bit error rate) is an alternative indication of the quality of the signal received. In one embodiment the tuner uses a detected error rate as a feedback mechanism to vary parameters m and n for improved reception.

Figure 6:
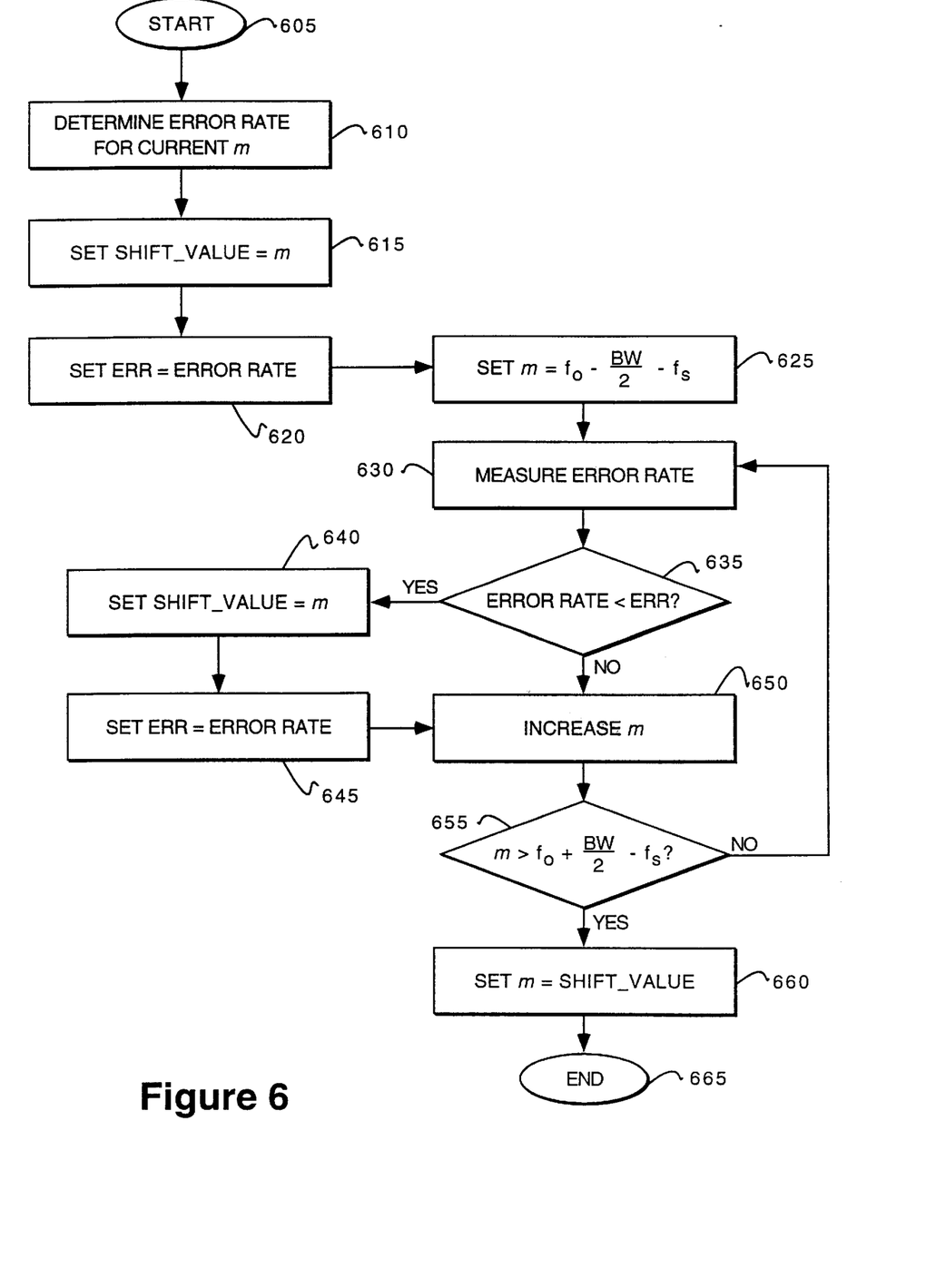
FIG. 6 illustrates a flow diagram for using a detected error rate of digital communications carried by a selected channel to improve tuning of the selected channel.

FIG. 6 illustrates one method for using the detected error rate as a feedback mechanism to vary m or n in order to improve reception. A shift value variable and an error variable are initialized to m and the current error rate. This technique varies m to move the carrier across the entire pass band of the filter. As the carrier is moved across the pass band, the error rate of the digital communication is determined. If the error rate is less than that indicated by the error variable, the shift value variable and the error variable are updated to m and the error rate, respectively. After moving the carrier across the pass band of the filter, the shift value variable indicates the m corresponding to the lowest error rate. Therefore, m is set to the value indicated by the shift value variable.

The method begins at step 605. In step 610, the error rate is determined for the current m. A shift value variable (SHIFT_VALUE) is initialized to m in step 615. In step 620 an error variable (ERR) is initialized to the error rate. In step 625, m is set to place the up-converted carrier at the bottom of the pass band of the filter, i.e., $$m = f_o - \frac{BW}{2} - f_s.$$

In step 630, the error rate is measured again. Step 635 determines if the error rate is an improvement. If the error rate is less than ERR, then SHIFT_VALUE and ERR are updated. In particular, SHIFT_VALUE is set to m in step 640, and ERR is set to the error rate in step 645. After either step 645 or step 635, processing continues by incrementing m in step 650. Steps 630 thru 650 are repeated until the selected carrier has been moved across the pass band of the filter. This is determined in step 655 by testing if $$m > f_o + \frac{BW}{2} - f_s.$$

After the selected carrier has been moved across the pass band of the filter, m is set to the value indicated by SHIFT_VALUE in step 660. This moves $f_s+m$ to the frequency within the pass band of the filter which resulted in the lowest detected error rate. In one embodiment, the up-conversion table is updated with the value indicated by SHIFT_VALUE. The process ends in step 665.

The method illustrated in FIG. 6 is applicable for gross tuning within the entire pass band of the filter. Alternatively, instead of pursuing the entire pass band, $f_s+m$ can be varied within some predetermined threshold δ about its current value to locate an m which provides a lower error rate. In one embodiment, if increasing or decreasing m results in a lower error rate, then the step of increasing or decreasing m and measuring the error rate are repeated until 1) an increase in error rate is detected, 2) m is outside the range ±δ of its original value, or 3) the carrier has been shifted beyond the top or bottom of the pass band.

Figure 7:
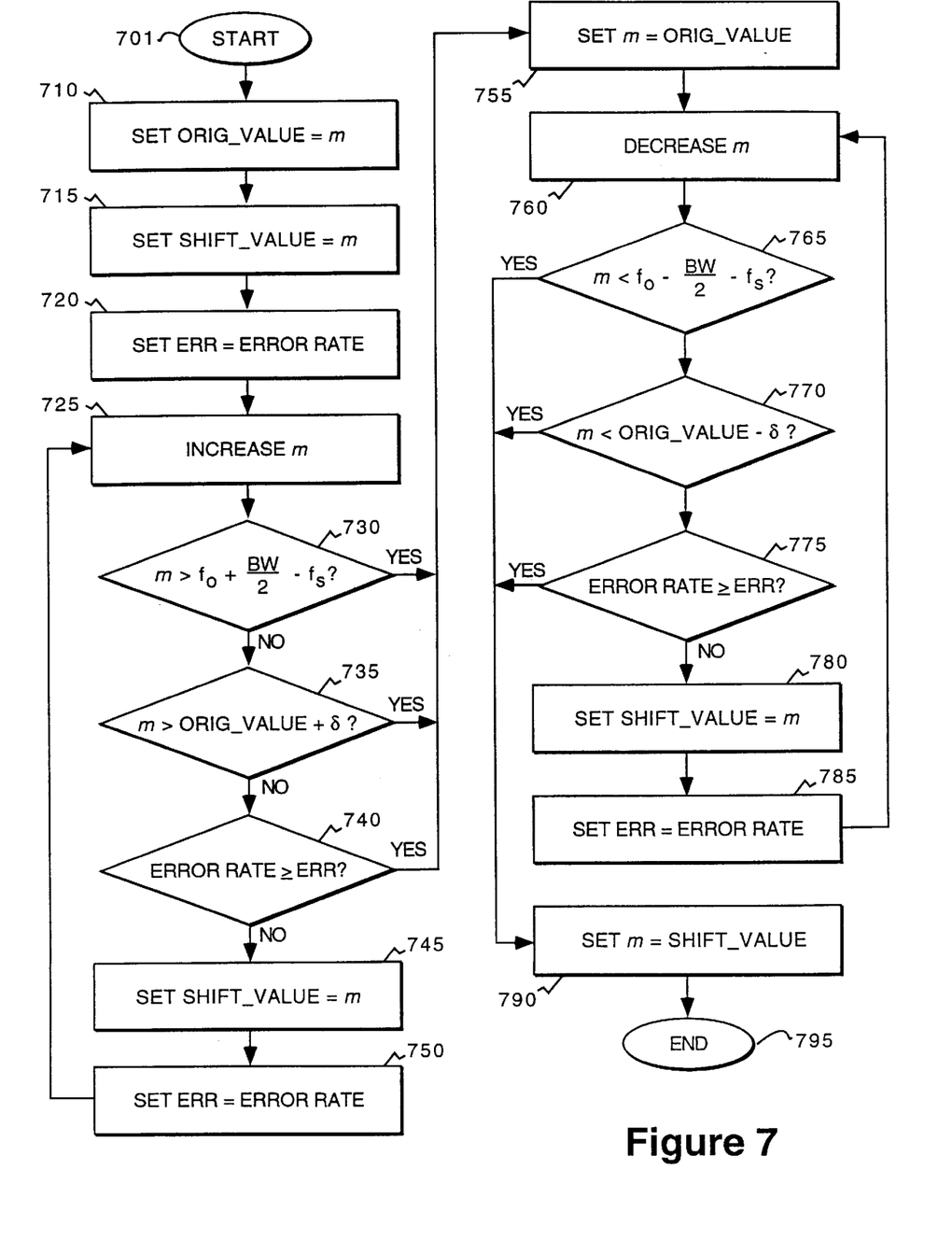
FIG. 7 illustrates a flow diagram for fine tuning a selected channel in accordance with a detected error rate of digital communications carried by the selected channel.

FIG. 7 illustrates one method for varying m in order to fine tune reception of the selected channel. First m is slightly increased. As long as (1) m is within δ of the original value of m, and (2) the error rate is decreasing, and (3) the carrier is still within the pass band of the filter, then m will continue to increase. Otherwise, m is returned to its original value and then slightly decreased. As long as (1) m is within δ of the original value of m, and (2) the error rate is decreasing, and (3) the carrier is still within the pass band of the filter, then m will continue to decrease. Once (1) the bounds of the pass band have been exceeded, or (2) m is no longer within δ of the original value, or (3) the error rate begins to increase, the process proceeds to set m to the value which resulted in the lowest measured error rate.

The fine tuning process begins in step 701. Variables are initialized in steps 710, 715, and 720. For example, the original value variable (ORIG_VALUE) and the shift value variable (SHIFT_VALUE) are set to m in steps 710 and 715, respectively. The error variable (ERR) is set to the error rate in step 520.

In step 725, m is increased. Step 730 determines whether the selected carrier has been shifted beyond the pass band of the filter. Step 735 determines whether m is still within some predetermined amount, δ, of its original value by checking if m>ORIG_VALUE+δ. Step 740 determines if the increased frequency results in a lower error rate by comparing the current error rate with ERR. If the error rate is less than ERR, then SHIFT_VALUE is updated with the increased m in step 745. ERR is updated with the current error rate in step 750. As long as (1)

$$m \leq f_o + \frac{BW}{2} - f_s,$$

and (2) m≦ORIG_VALUE+δ, and (3) error rate<ERR, then the process of increasing m and updating SHIFT_VALUE and ERR continues.

Once (1) an increase in the error rate is detected, or (2) m has been increased beyond δ from its original value, or (3) $f_s$ has been shifted outside the pass band of the filter, processing proceeds to step 755.

In step 755, m is set to its original value, ORIG_VALUE. In step 760, m is decreased. Step 765 determines whether the carrier has been shifted beyond the pass band of the filter. Step 770 determines whether m is still within some predetermined amount, δ, of its original value by checking if m<ORIG_VALUE−δ. Step 775 determines if the decreased frequency results in a lower error rate by comparing the current error rate with ERR. If the error rate is less than ERR, then SHIFT_VALUE is updated with the decreased m in step 780. ERR is updated with the current error rate in step 785. As long as (1)

$$m \geq f_o - \frac{BW}{2} - f_s,$$

and (2) m≧ORIG_VALUE−δ, and (3) error rate <ERR, then the process of decreasing m and updating SHIFT_VALUE and ERR continues.

Once (1) an increase in the error rate is detected, or (2) m has been decreased beyond δ from its original value, or (3) $f_s$ has been shifted outside the pass band of the filter, processing proceeds to step 790.

In step 790 m is set to the value indicated by SHIFT_VALUE. Thus m is set to the value corresponding to the lowest detected error rate. The process is completed in step 795.

In the embodiments illustrated, the up-converter and down-converter apparatus are programmable. Phase filter values, m, and n are programmable and can be specified for any given channel. This permits software management of filtration, phase noise, channel selection and fine tuning. Tuning enhancements can be accomplished programmatically by adding or modifying software modules rather than through mechanical hardware modification such as bending and stretching inductors.

The method and apparatus for selecting channels for television and CATV devices eliminates the multiple band tuners required for bandswitching. The elimination of air-core inductors in the tuner circuitry reduces the susceptibility of errors induced by vibration. The programmability feature permits controlling up-conversion and down-conversion dynamically through software to eliminate frequency dependent anomalies. In addition, phase filter control permits modifying phase filters for each of the up-conversion and down-conversion stages to reduce the effective net phase noise otherwise independently introduced by each stage.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of tuning channels for television and community antenna television (CATV) devices, comprising the steps of:
    a) receiving a radio frequency input (RFI) signal having a plurality of carrier signals corresponding to broadcast channels;
    b) up-converting the RFI signal in accordance with a selected channel to locate a corresponding selected carrier signal at a first intermediate frequency;
    c) filtering the up-converted RFI signal; and
    d) down-converting the filtered RFI signal to locate the selected carrier at a second intermediate frequency wherein the first intermediate frequency varies in accordance with the channel selected as determined by a bit error rate of a received data signal in the selected channel.

2. The method of claim 1 wherein at least one of the plurality of carrier signals is in a range of approximately 50 MHz to 850 MHz.

3. The method of claim 1 wherein the first intermediate frequency is greater than 900 MHz.

4. The method of claim 1 wherein the second intermediate frequency is approximately 43.75 MHz.

5. The method of claim 1 wherein the second intermediate frequency is approximately 36.125 MHz.

6. The method of claim 1 wherein a bandwidth of the selected channel is approximately 6 MHz.

7. The method of claim 1 wherein a bandwidth of the selected channel is approximately 8 MHz.

8. A method of tuning a channel for television and community antenna television (CATV) devices, comprising the steps of:
    a) selecting an upshifting frequency m in accordance with a selected channel;
    b) up-converting a radio frequency input (RFI) signal to a first intermediate frequency signal, wherein the RFI signal includes at least one carrier of frequency $f_s$, the carrier corresponding to the selected channel, wherein the carrier is up-converted to $f_s+m$;
    c) filtering the first intermediate frequency signal to provide a filtered signal;
    d) selecting a downshifting frequency n in accordance with the selected channel and a desired output frequency, K;
    e) down-converting the filtered signal to provide a second intermediate frequency including a down-shifted carrier of frequency $f_s+m-n$, wherein $f_s+m-n=K$, wherein $f_s+m$ varies in accordance with the channel selected as determined by a bit error rate of a digital signal in the selected channel.

9. The method of claim 8 wherein step a) further comprises the step of:
    i) retrieving m from a table indexed by channels.

10. The method of claim 8 wherein step d) further comprises the step of:
    i) retrieving n from a table indexed by channels.

11. The method of claim 8 further comprising the steps of:
    f) selecting phase filter data from a phase noise table;
    g) applying the phase filter data to control phase noise introduced in each of steps b) and d) to substantially minimize net phase noise introduced from performing both of steps b) and d).

12. A method of tuning a channel for television and community antenna television (CATV) devices, comprising the steps of:
    a) determining a carrier ($f_s$) within a radio frequency input signal wherein the carrier is associated with a selected channel carrying digital communication;
    b) selecting a shift value m for the selected channel in a channel dependent manner such that $f_s+m$ for the selected channel is different from at least one other channel of the radio frequency input signal;
    c) up-converting the radio frequency input signal to a first intermediate frequency signal, wherein the carrier is at $f_s+m$;
    d) filtering the intermediate signal to provide a filtered signal;
    e) down-converting the filtered signal to a second intermediate signal, wherein the carrier is at $f_s+m-n=K$;
    f) determining an error rate of the digital communications within the down-shifted carrier; and
    g) varying m and n in accordance with the error rate to reduce the error rate.

13. The method of claim 12 wherein step b) further comprises the step:
    i) setting $$m = f_o - \frac{BW}{2} - f_s,$$

wherein $f_o$ is a center frequency associated with filtering in step d), wherein BW is a bandwidth associated with filtering in step d).

14. The method of claim 12 wherein the error rate is a bit error rate BER) of the digital communications carried by the selected channel.

15. The method of claim 12, wherein step g) further comprises the steps:
    i) initializing a shift value variable (SHIFT_VALUE) and an error variable (ERR);

ii) setting $$m = f_o - \frac{BW}{2} - f_s,$$

wherein $f_o$ is a center frequency associated with filtering in step d), wherein BW is a bandwidth associated with filtering in step d);
   iii) measuring a current error rate (CER);
   iv) updating SHIFT_VALUE and ERR to m and CER, respectively, if CER<ERR;
   v) increasing m;
   vi) repeating steps iii) thru v) until $$m > f_o + \frac{BW}{2} - f_s;$$

vii) setting m=SHIFT_VALUE.

16. The method of claim 12, wherein step g) further comprises the steps:
   i) initializing an original value variable (ORIG_VALUE) and a shift value variable (SHIFT_VALUE) to m;
   ii) initializing an error variable (ERR);
   iii) increasing m;
   iv) determining a current error rate (CER);
   v) updating SHIFT_VALUE and ERR to m and CER, respectively if CER<ERR;
   vi) repeating steps iii) thru v) while $$m \leq f_o + \frac{BW}{2} - f_s$$

and m≦ORIG_VALUE+δ and CER<ERR, wherein δ is predetermined; and
   vii) setting m=SHIFT_VALUE.

17. The method of claim 12, wherein step g) further comprises the steps:
   i) initializing an original value variable (ORIG_VALUE) and a shift value variable (SHIFT_VALUE) to m;
   ii) initializing an error variable (ERR);
   iii) decreasing m;
   iv) determining a current error rate (CER);
   v) updating SHIFT_VALUE and ERR to m and CER, respectively if CER<ERR;
   vi) repeating steps iii) thru v) while $$m \leq f_o + \frac{BW}{2} - f_s$$

and m≦ORIG_VALUE+δ and CER<ERR, wherein δ is predetermined; and
   vii) setting m=SHIFT_VALUE.

18. The method of claim 12 wherein step g) further comprises the steps of:
   i) initializing an original value variable (ORIG_VALUE) and a shift value variable (SHIFT_VALUE) to m;
   ii) initializing an error variable (ERR);
   iii) increasing m;
   iv) determining a current error rate (CER);
   v) updating SHIFT_VALUE and ERR to m and CER, respectively if CER<ERR;
   vi) repeating steps iii) thru v) while $$m \leq f_o + \frac{BW}{2} - f_s$$

and m≦ORIG_VALUE+δ and CER<ERR, wherein δ is predetermined; and
   vii) setting m=ORIG_VALUE;
   viii) decreasing m;
   ix) determining CER;
   x) updating SHIFT_VALUE and ERR to m and CER, respectively if CER<ERR;
   xi) repeating steps viii) thru x) while $$m \geq f_o - \frac{BW}{2} - f_s$$

and m≧ORIG_VALUE−δ and CER<ERR; and
   xii) setting m=SHIFT_VALUE.

19. A tuning apparatus for television and community antenna television (CATV) devices, comprising:
   an up-converter coupled to receive a radio frequency input (RFI) signal including multiple channels and each channel having a varying carrier frequency $f_s$, wherein the up-converter up-converts a selected channel of the RFI by m to provide a first intermediate frequency signal including an up-shifted selected carrier of frequency $f_s+m$, where $f_s+m$ varies among the channels;
   a filter coupled to provide a filtered signal from the first intermediate frequency signal, wherein the filter has a bandwidth BW and a center frequency $f_o$, wherein $$|f_s + m - f_o| \leq \frac{BW}{2};$$

a down-converter coupled to receive the filtered signal, wherein the down-converter down-converts the filtered signal by n to provide a second intermediate frequency signal including a down-shifted selected carrier of frequency $f_s+m-n$;
   control circuitry for selecting m and n in accordance with an error rate of a digital signal within the selected channel corresponding to the carrier, wherein $f_s+m-n=K$, wherein K is substantially independent of $f_s$ for any selected carrier.

20. The apparatus of claim 19 wherein $f_s+m$ is substantially constant for any selected carrier.

21. The apparatus of claim 19 wherein m and n vary in accordance with $f_s$.

22. The apparatus of claim 19 wherein the up-converter further comprises:
   a phase locked loop providing a control signal corresponding to a selected channel;
   a variable frequency oscillator providing a first signal in accordance with the control signal;
   a mixer for mixing the RFI signal and the first signal to provide the first intermediate frequency signal.

23. The apparatus of claim 19 wherein the down-converter further comprises:
   a phase locked loop providing a control signal corresponding to a selected channel;
   a variable frequency oscillator providing a first signal at a first frequency in accordance with the control signal;

a mixer for mixing the filtered signal and the first signal to provide the second intermediate frequency signal.

24. The apparatus of claim 19 wherein the first intermediate frequency is greater than 850 MHz.

25. The apparatus of claim 19 wherein the filter is a surface acoustic wave filter.

26. The apparatus of claim 19 further comprising:

anomaly shifting circuitry coupled to the up-converter to vary m to avoid frequency-dependent anomalies, wherein the anomaly shifting circuitry varies n in accordance with m to ensure $f_s+m-n=K$.

27. The apparatus of claim 19 further comprising:

phase correction circuitry for providing first phase data to the up-converter and second phase data to the down-converter for reconfiguring the up-converter and down-converter to minimize the net phase noise induced by the up-converter and the down-converter.

\* \* \* \* \*